United States Patent [19]
Takaishi

[11] Patent Number: 6,040,215
[45] Date of Patent: *Mar. 21, 2000

[54] METHOD OF MANUFACTURING SEMICONDUCTOR DEVICE INCLUDING MEMORY CELL HAVING TRANSISTOR

[75] Inventor: Yoshihiro Takaishi, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/870,861

[22] Filed: Jun. 6, 1997

[30] Foreign Application Priority Data

Jun. 7, 1996 [JP] Japan .................................. 8-145995

[51] Int. Cl.⁷ .............................................. H01L 21/8242
[52] U.S. Cl. ............................................ 438/253; 438/254
[58] Field of Search ..................................... 438/253–256, 438/396–398

[56] References Cited

U.S. PATENT DOCUMENTS

| | | |
|---|---|---|
| 5,102,820 | 4/1992 | Chiba . |
| 5,137,842 | 8/1992 | Chan et al. . |
| 5,443,993 | 8/1995 | Park et al. . |
| 5,578,516 | 11/1996 | Chou . |

FOREIGN PATENT DOCUMENTS

| | | |
|---|---|---|
| 5175451 | 7/1993 | Japan . |
| 5-226583 | 9/1993 | Japan . |
| 6151748 | 5/1994 | Japan . |
| 824174 | 3/1996 | Japan . |
| 8107187 | 4/1996 | Japan . |

*Primary Examiner*—Jey Tsai
*Attorney, Agent, or Firm*—Sughrue, Mion, Zinn, Macpeak & Seas, PLLC

[57] ABSTRACT

A method of manufacturing a semiconductor device comprises the steps of forming a first insulating film on a semiconductor substrate, forming a contact hole in the first insulating film, burying a first conductive film into the contact hole, forming a second conductive film on the first insulating film to connect the second conductive film with the first conductive film, and forming a second insulating film on the second conductive film. The method further comprises the steps of selectively etching the second insulating film, the second conductive film, and a part of the first insulating film to produce a patterned second insulating film, a patterned conductive film, and a patterned first insulating film respectively, and forming sidewalls on sides of the patterned first and second insulating films and the patterned second conductive film to connect the sidewalls with the patterned second conductive film.

16 Claims, 10 Drawing Sheets

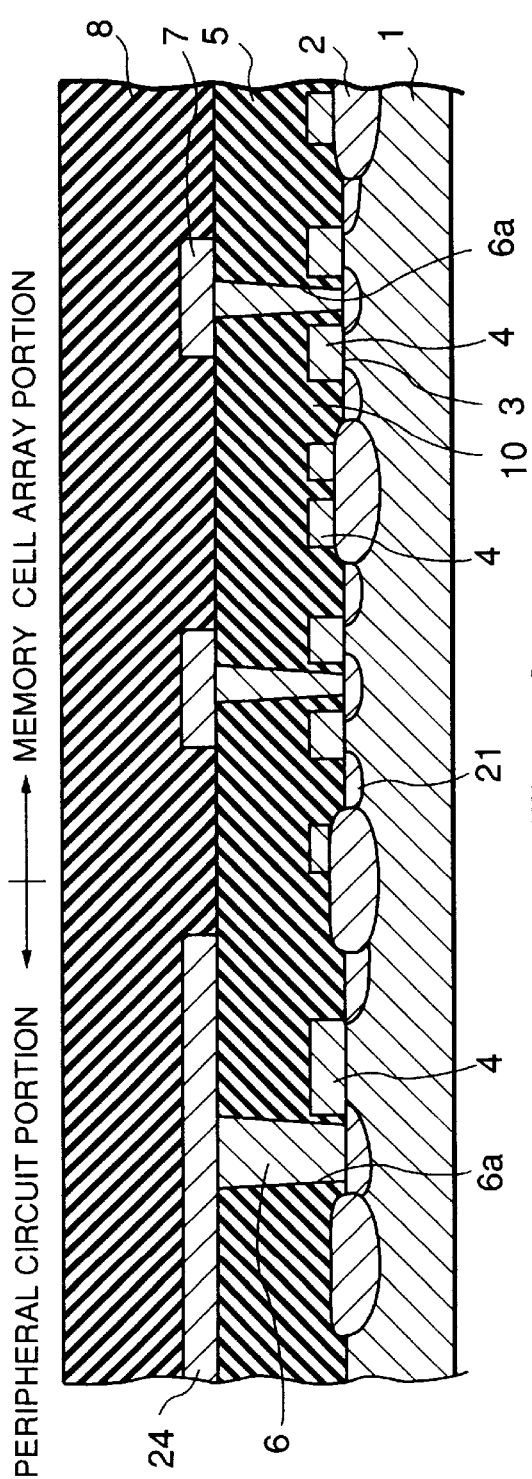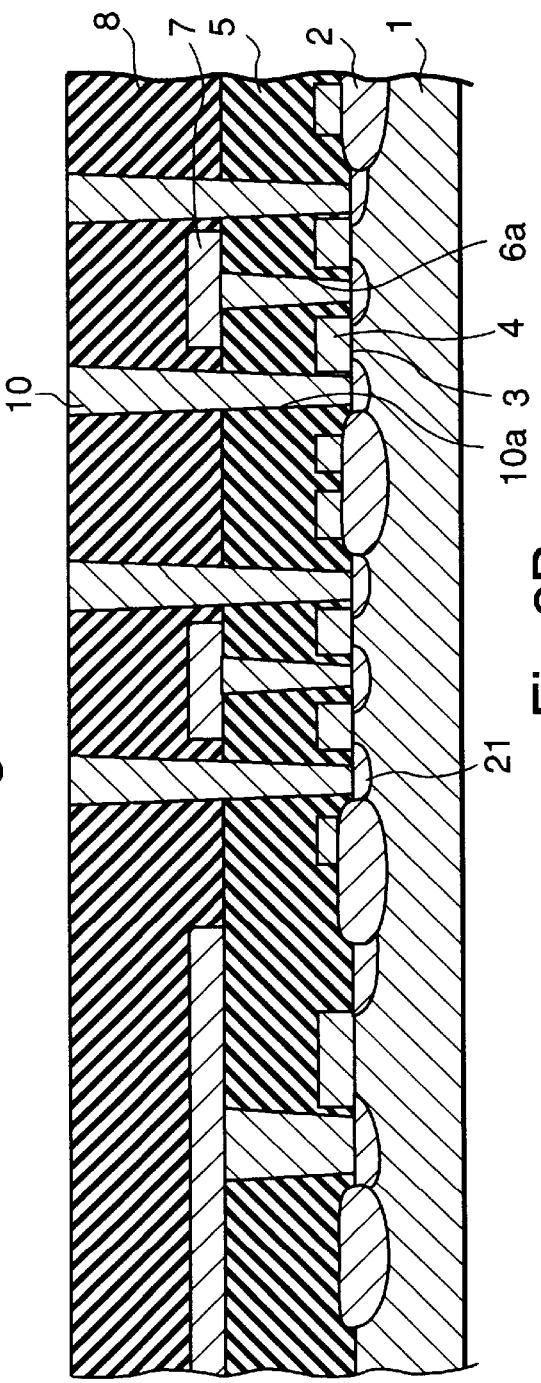

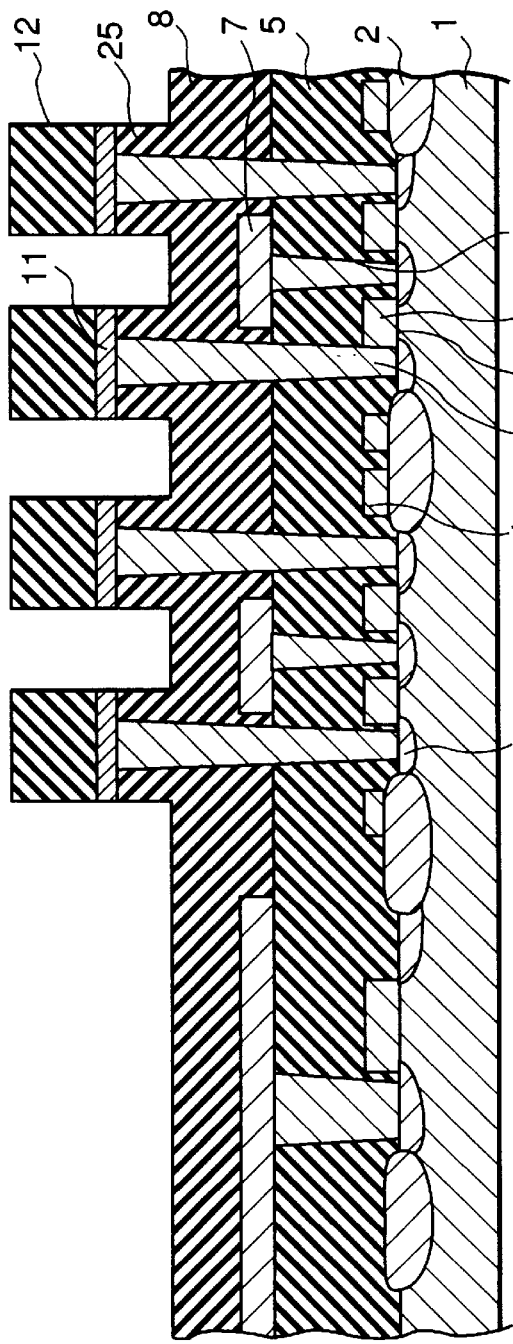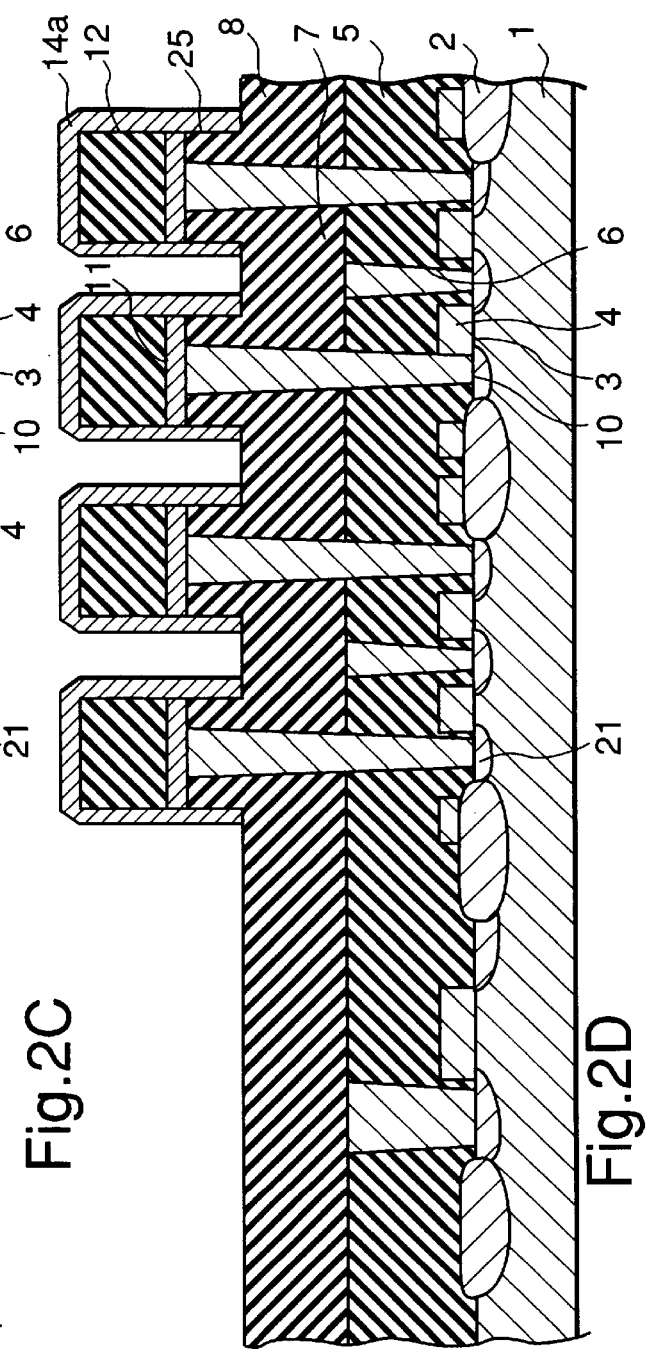

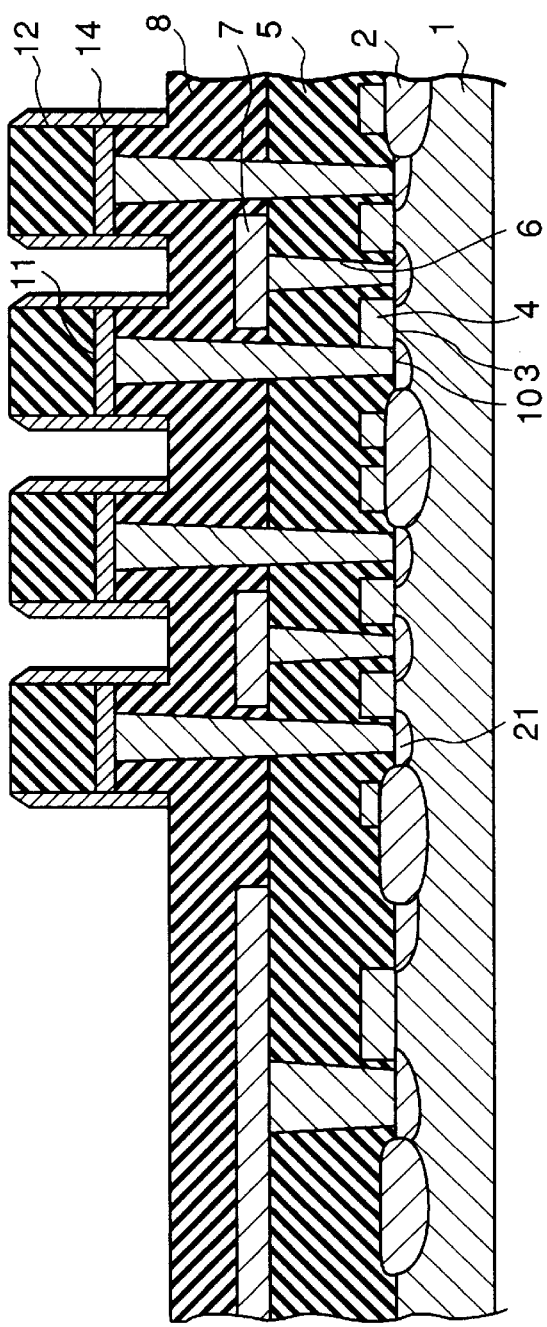
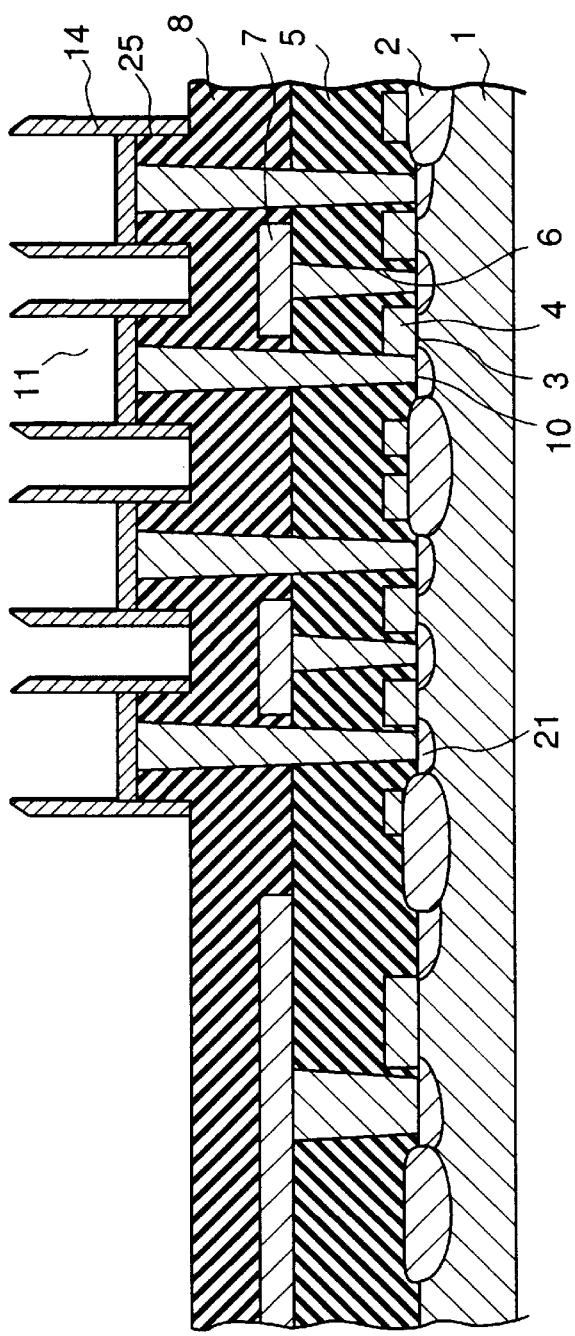
Fig.2E
Fig.2F

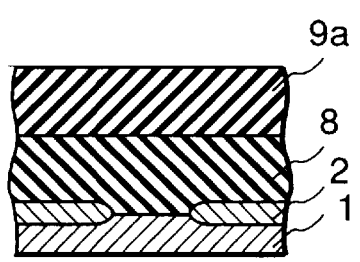 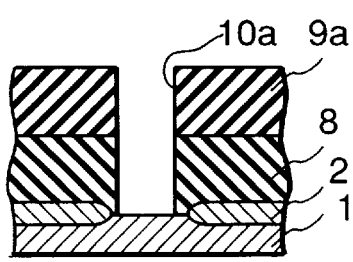 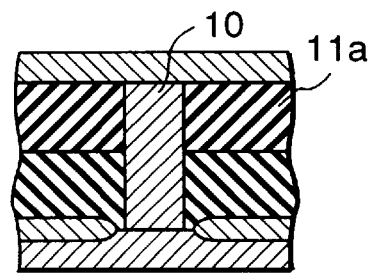
Fig.5A      Fig.5B      Fig.5C
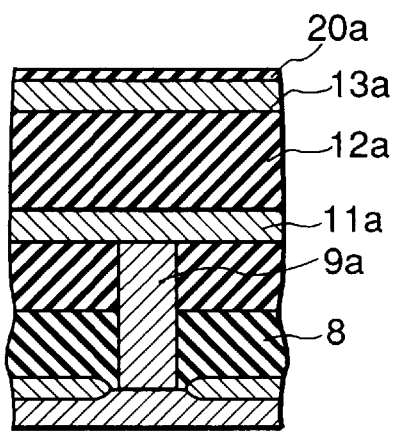 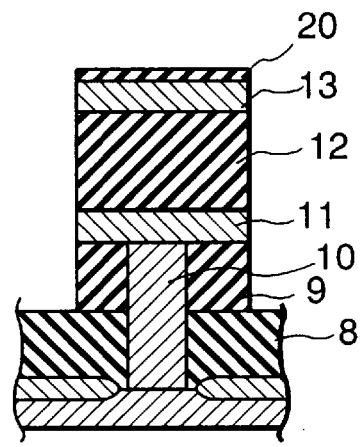
Fig.5D      Fig.5E
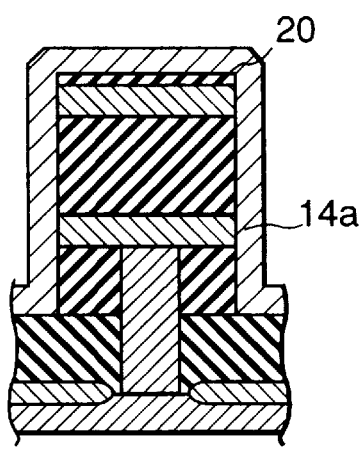 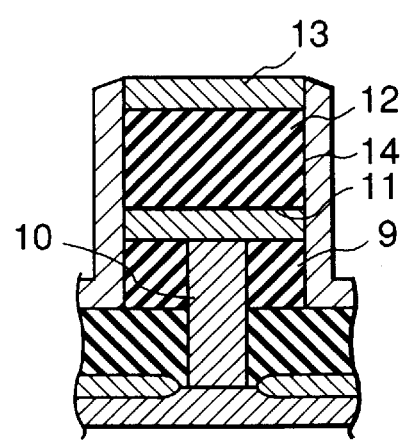
Fig.5F      Fig.5G

METHOD OF MANUFACTURING SEMICONDUCTOR DEVICE INCLUDING MEMORY CELL HAVING TRANSISTOR

BACKGROUND OF THE INVENTION

The present invention relates to method of manufacturing a semiconductor device, and more particularly, a dynamic random access memory (DRAM) having a stacked capacitor.

Conventionally, the DRAM comprises a plurality of memory cells. In each memory is stored the respective data. The memory cell consists of a cell transistor and a capacitor having a storage electrode.

Recently, such a memory has been highly integrated. However, the reduction of capacity of the storage electrode is undesirable from the viewpoint of the confidence of the data stored in a capacitor. Therefore, it is both important and a problem to secure the capacity of a memory cell.

To satisfy the demand, there has been proposed a stacked capacitor wherein a storage electrode is provided on a cell transistor. It is an aim of using a stacked capacitor to secure capacity by the height of the stacked storage electrode.

Such a memory having a stacked storage electrode is disclosed in Japanese Laid-Open (kokai) Patent Publication No. 5-226583 and will be described with reference to FIGS. 1A–1G.

As shown in FIG. 1A, a field oxide film 105 is formed on a p-type silicon substrate 101 and gate electrodes 104 are selectively formed through the respective gate insulating film 103 on the silicon substrate 101. Thereafter, n$^+$diffused layers 102 are formed within the surface region of the substrate 101 to form a source-drain region of a MOS transistor. The gate electrode 104 serves as a word line of a DRAM. An SiO$_2$ layer is deposited on the MOS transistor by a CVD method to thereby form a first interlayer insulating film 106. Boron-phosphorus doped silicate glass (BPSG) film is then deposited by a CVD method to a thickness of 100 nm, to thereby form a second interlayer insulating film 107a. A heating reflow is conducted on the entire surface to form a flat surface and the BPSG film is etched-back by a reactive ion etching, or RIE, method to thereby form a second interlayer insulating film 107b having a thickness of 500 nm as shown in FIG. 1B.

As shown in FIG. 1C, a contact hole 108 is formed in the first and second interlayer insulating film 106 and 107b to expose the n$^+$ diffused layer 102 by using a photolithographic technique. A poly-crystal silicon 109a is deposited on the second interlayer insulating film 107b and in the contact hole 108 to a thickness of 250 nm. After an etching mask is formed on a portion including the contact region (not shown), the poly-crystal silicon 109a is patterned by an anisotropic etching method to thereby form a pattered silicon film 109. Using the etching mask as a mask again, the second interlayer insulating film 107b is anisotropically etched to thereby provide the etched BPSG film having a thickness of 300 nm.

As a result, as shown in FIG. 1D, the second interlayer insulating film 107b under the patterned silicon film 109 is thicker than that not under the patterned silicon film 109.

Next, as shown in FIG. 1E, a thin film poly-silicon film 110a is deposited by a CVD method to a thickness of 150 nm.

As shown in FIG. 1F, the thin film poly-silicon film 110a is etched-back by an RIE method to produce sidewalls 110. The sidewalls 110 is electrically connected to the patterned silicon film 109 so that the side walls 110 and the patterned silicon film 109 function as a first (under) electrode of a capacitor.

Next, a storage electrode insulating film 111 is deposited on the entire surface and a poly-silicon film is deposited on the storage electrode insulating film 111. The polysilicon film are then patterned by a photolithographic technique to thereby produce a second (upper) electrode 112. At this time, the storage electrode insulating film 111 is patterned, as well. An interlayer insulating film 113 is deposited to a thickness of 400 nm. A contact hole is then formed in the interlayer insulating film 113 to expose or reach the n$^+$ diffused layer 102 by a photolithographic technique. Thereafter, an aluminum film is deposited to produce a bit line 114. As a result, a conventional DRAM cell having a stacked storage capacitor is provided as shown in FIG. 1G.

The capacitor consisting of the memory cell has the first electrode having the patterned silicon film 109 and sidewalls 110. The first electrode covers the top and both side faces of the second interlayer insulating film 107b under the first electrode. Therefore, the structure prevents the first electrode of the capacitor from falling or peeling off since the first electrode of the capacitor is firmly maintained by the shape or connection relation of the first electrode and the second interlayer insulating film 107b.

However, In the case of a more miniaturized DRAM of not less than 256 Mb memory, it becomes more difficult for data stored in the above-mentioned capacitor to be secured reliablely.

SUMMARY OF THE INVENTION

It is therefore an object of the present invention to provide an improved manufacturing method of a semiconductor device which can prevent a storage electrode from falling or peeling off and secure the capacity thereof.

A method of manufacturing a semiconductor device comprises the steps of forming a first insulating film on a semiconductor substrate, forming a contact hole in the first insulating film, burying a first conductive film into the contact hole, forming a second conductive film on the first insulating film to connect the second conductive film with the first conductive film, forming a second insulating film on the second conductive film, selectively etching the second insulating film, the second conductive film, and a part of the first insulating film to produce a patterned second insulating film, a patterned conductive film, and a patterned first insulating film respectively, and forming sidewalls on sides of the patterned first and second insulating films and the patterned second conductive film to connect the sidewalls with the patterned second conductive film.

BRIEF DESCRIPTION OF THE DRAWINGS

The above and other objects, advantages and features of the present invention will be more apparent from the following description taken in conjunction with the accompanying drawings, in which:

FIGS. 2A–2G are cross-sectional views showing respective steps of a method of manufacturing a semiconductor device according to a first embodiment of the present invention;

FIGS. 5A–5G are cross-sectional view showing respective steps of a method of manufacturing a capacitor of a semiconductor device according to a second embodiment of the present invention.

DETAILED DESCRIPTION OF THE PREFERRED EMBODIMENTS

Figure 1A:
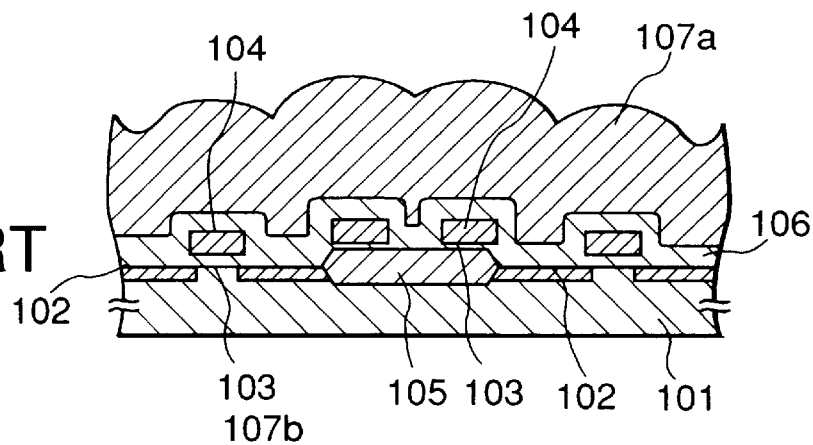
FIGS. 1A–1G are cross-sectional views showing respective steps of a method of manufacturing a semiconductor device of a prior art.
Figure 1B:
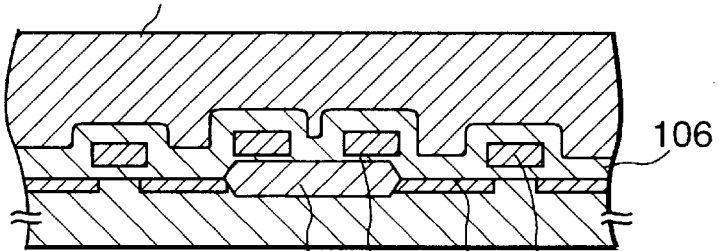
Figure 1C:
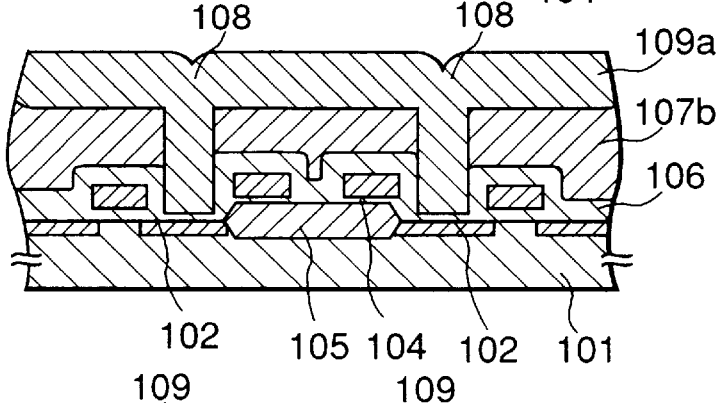
Figure 1D:
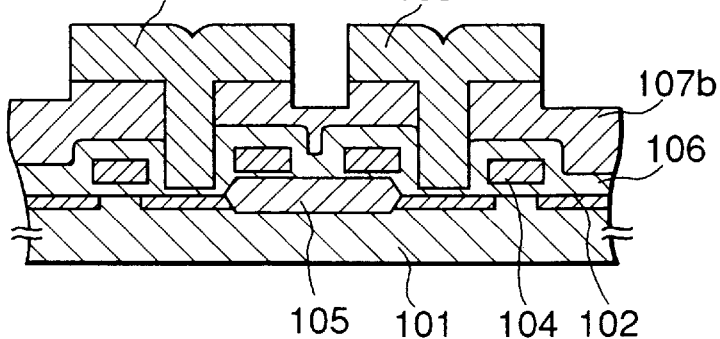
Figure 1E:
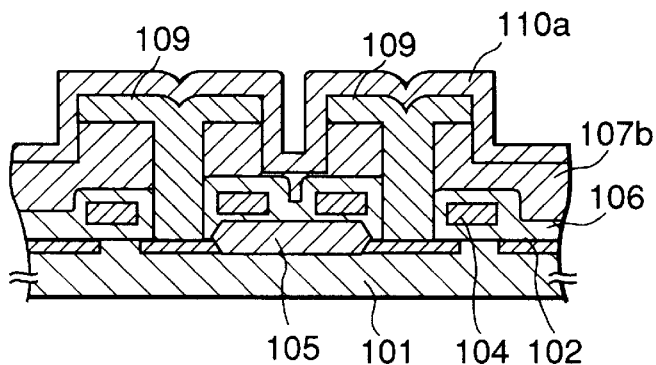
Figure 1F:
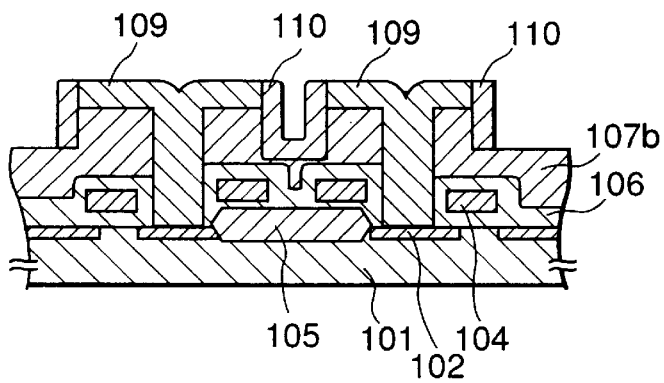
Figure 1G:
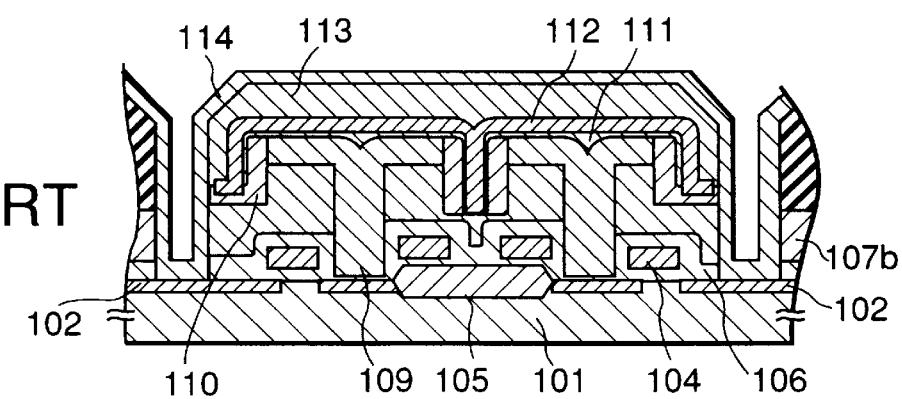

As shown in FIG. 2A, a p-type silicon substrate 1 is divided into peripheral circuit portion and memory cell array portion. A kind of peripheral circuit used by DRAM, for example, a decoder circuit, sense amplifier and so on is formed in the peripheral circuit portion and a plurality of memory cells is formed in the memory cell array potion. Four element separation regions 2 are formed on a p type silicon substrate 1 to redistrict element formation regions. A gate electrode 4 is formed through the respective gate insulating film 3 on predetermined portions of the element formation regions of the substrate 1. A diffused layer 21 is selectively formed in the element formation regions of the substrate 1. The diffused layer 21 functions as a source-drain region of a cell transistor. A first interlayer insulating film 5 is deposited on the element separation regions 2 and the element formation regions. The surface of the first interlayer insulating film 5 is performed with flat treatment by an etch-back technic or chemical and mechanical polishing (CMP) technic. A bit line contact hole 6a is formed in the first interlayer insulating film 5 to expose the diffused layer 21 and a contact plug 6 formed by polysilicon and so on is buried in the bit line contact hole 6a. A bit line 7 and a signal line or power source line 24 are formed on the first interlayer insulating film 5 to electrically connect to the diffused layer 21 through the contact plug 6. A second interlayer insulating film 8 is formed on the bit line 7, line 24 and the first interlayer insulating film 5. The second interlayer insulating film 8 is made of NON-doped silicon oxide (NSG).

As shown in FIG. 2B, a storage electrode contact hole 10a is formed in the first and second interlayer insulating film 5 and 8 to expose the diffused layer 21 and a contact plug 10 formed by conductive film, for example, polysilicon film is buried in the storage electrode contact hole 10a.

As shown in FIG. 2C, a conductive film, for example, a polysilicon film is deposited on the second interlayer insulating film 8 to a thickness of about 100 nm and an electrode insulating film made of BPSG or phosphorus doped silicate glass (PSG) film is deposited on the polysilicon film to a thickness of about 600 nm respectively on the entire surface of the substrate 1. The electrode insulating film and plysilicon film is selectively patterned by using a well-known photolithographic technique and etching technique to produce respectively a core oxide film or patterned electrode insulating film 12 of a cylindrical capacitor and a patterned conductive film or horizontal silicon film 11. Continuously, the second interlayer insulating film 8 is selectively etched-back to 300 nm to produce a patterned second interlayer insulating film 25 under the horizontal silicon film 11.

As shown in FIG. 2D, a polysilicon film 14a is deposited on the entire surface to a thickness of about 100 nm.

As shown in FIG. 2E, the polysilicon film 14a is etched-back until the core oxide film 12 or the second interlayer insulating film 8 on the peripheral circuit portion are exposed to produce sidewalls or vertical silicon film 14 connected to both sides of the core oxide film 12 and the patterned second interlayer insulating film 25. The horizontal silicon film 12 and sidewalls 14 consists of the first or under electrode of the memory cell capacitor. In this case, since the core oxide film 12 serves as an etching stopper, the sidewalls 14 are easily and stably formed. The horizontal silicon film 11 is fixed by not only the plug 10 but also the sidewalls 14 since the horizontal silicon film 11 is connected to not only the plug 10 but also the sidewalls 14 each formed with same material. This can prevent the horizontal silicon film 11 from falling or peeling off from the plug 10. Therefore, falling or peeling off of the first or under electrode consisting of the horizontal silicon film 11 and sidewalls 14 is prevented.

As shown in FIG. 2F, the core oxide film 12 is selectively etched away. In this case, the second interlayer insulating film 8 on the peripheral circuit portion is barely etched. That is why the second interlayer insulating film 8 is formed by the NSG and the core oxide film 12 is formed by the BPSG or PSG each having a different etching rate from the NSG. For example, the core oxide film 12 is etched by HF vapor treatment.

Figure 2G:
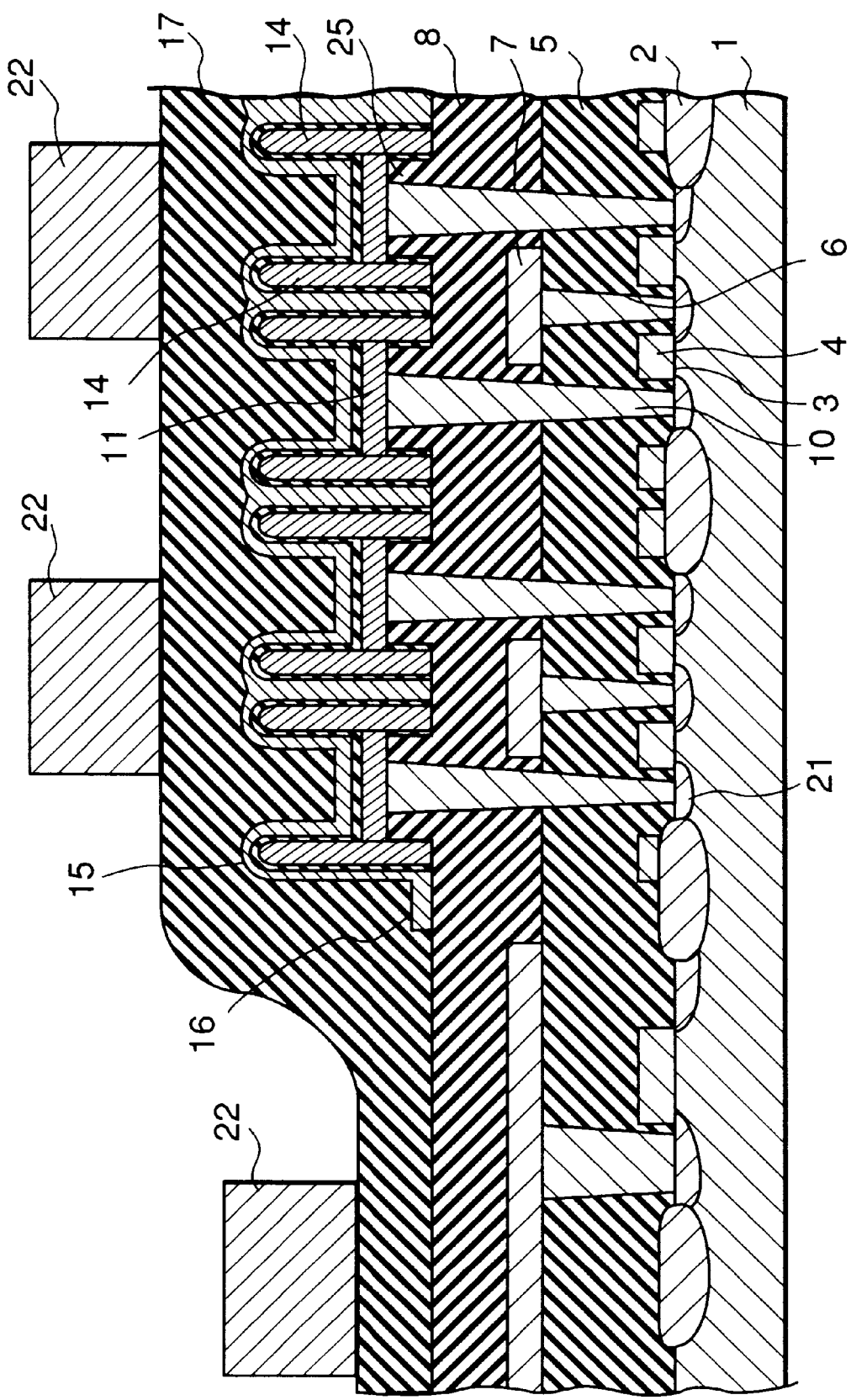

As shown in FIG. 2G, a capacity storage insulating film or a dielectric film 15 is formed to cover the sidewalls 14 and top surface of the horizontal silicon film 11. A second or upper electrode 16 formed by polysilicon is formed on the capacity storage insulating film 15. A third interlayer insulating film 17 is formed on the upper electrode 16 and the second interlayer insulating film 8 of the peripheral circuit portion. An aluminum wiring layer 22 is formed on the third interlayer insulating film 17. The stacked capacitor electrode has a height of about 1 $\mu$m.

According to the above embodiment, the shape of the first or under electrode is an H structure. Therefore, the capacitor of the present invention has capacity larger than the capacitor of the prior art.

Figure 3:
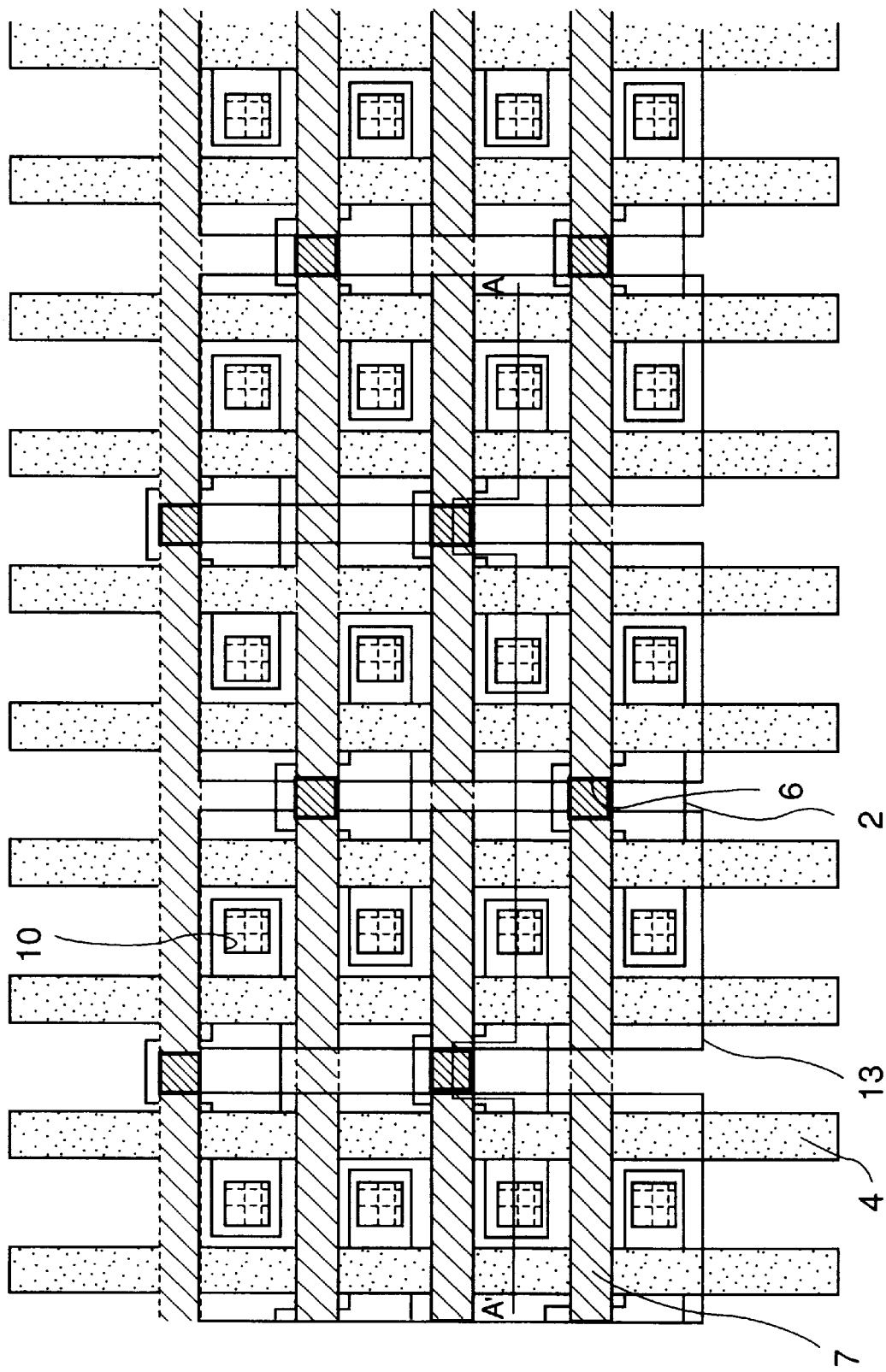
FIG. 3 is a plan view illustrative of a part of memory cell array portion according to the first embodiment of the present invention.

FIG. 3 is a plan view illustrative of the memory cell array portion shown in FIG. 2G. The cross-sectional view of the memory cell array potion shown in FIG. 2G is a cross-sectional view shown in A—A' line of FIG. 3.

Referring FIG. 3, each of the element formation regions is surrounded by the element separation region 2. In a horizontal direction, the element formation regions exiting on a first line and a third line are located in a same portion and the element formation regions existing on a second line and a fourth line are located in a same portion. Element formation regions exiting on even-numbered lines and element formation regions exiting on odd or uneven-numbered lines are alternately formed. In a vertical direction, element formation regions exiting on a first column and a third column are located in a same portion and element formation regions existing on a second column and a fourth column are located in a same portion. Element formation regions exiting on even-numbered columns and element formation regions exiting on odd or uneven-numbered columns are alternately formed. That is, each element formation regions are formed with stagger layout. A plurality of gate electrodes 4 are arranged in parallel each other. The gate electrodes function as word lines. Two gate lines runs through on one element formation region. A plurality of bit lines 7 are arranged in parallel each other and each bit lines 7 is perpendicular to each word lines 4. One bit line 7 runs through on one element formation region. That is, two cell transistors are formed in one element formation region, each rectangles 27 shows the under electrode of a capacitor.

In the first embodiment according to the present invention, the thickness of the core oxide film 12 is 600 nm. The thickness meanwhile determines the electrode height of the cylindrical capacitor. The electrode height may be determined based on necessary capacity. Furthermore, the height of the patterned second interlayer insulating film 25 is 300 nm. However, the height is not limited to 300 nm. The height of the patterned second interlayer insulating film 25 should be larger than 300 nm to provide larger capacity.

However, in fact, the larger capacity gets, the deeper or bigger the patterned second interlayer insulating film 25 is etched-back. On the other hand, it is difficult to control the height of the patterned second interlayer insulating film 25 strictly by etching. As a result, the bit line 7 is likely to connect to the under electrode, especially the polysilicon film 14a, to thereby produce a shortcut circuit between the bit line 7 and the under electrode. The second embodiment of the present invention provides the semiconductor device to prevent the production of the shortcut circuit.

Figure 4:
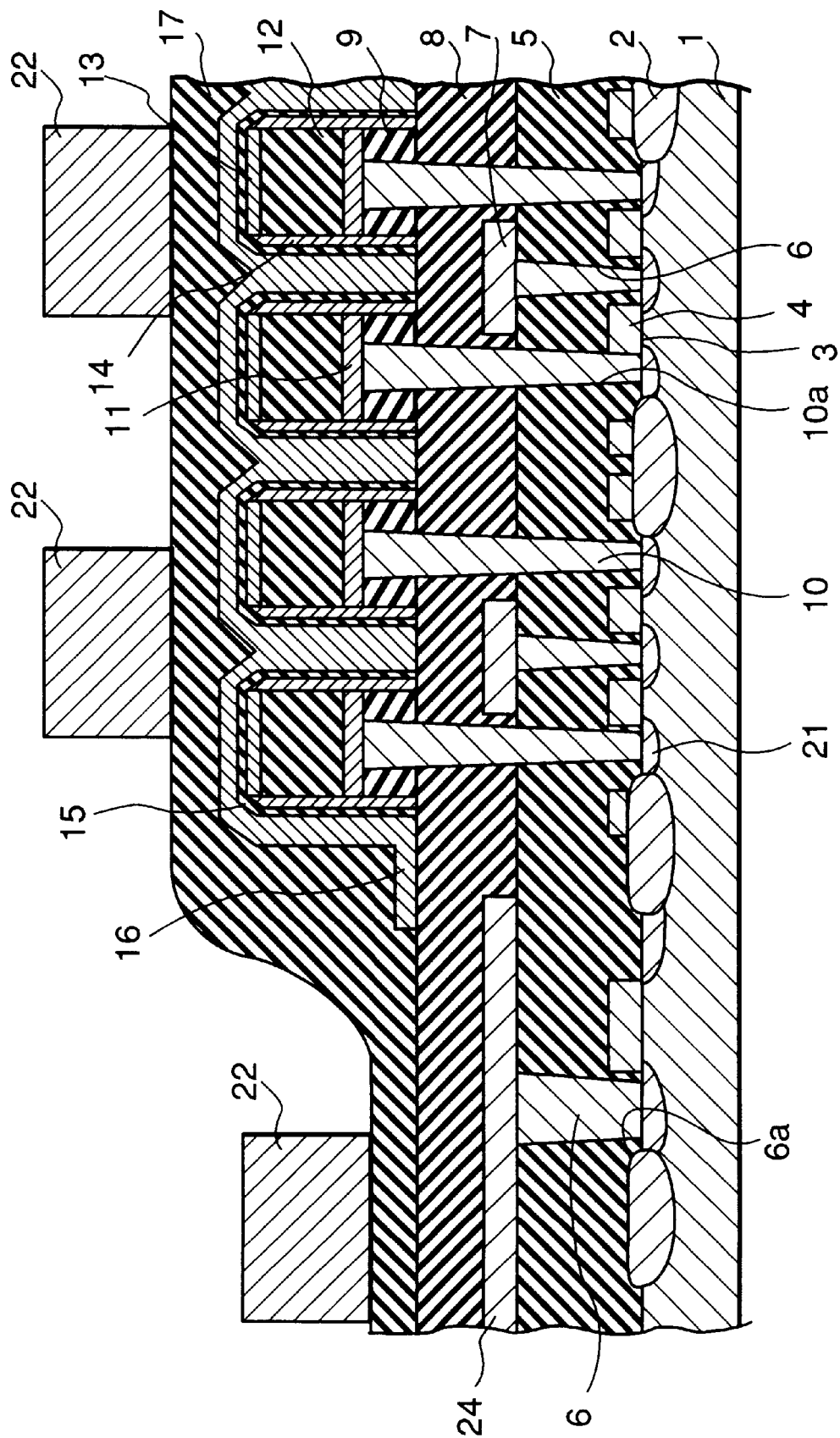
FIG. 4 is a cross-sectional view according to a second embodiment of the present invention.

FIG. 4 is a cross-sectional view according to a second embodiment of the present invention. The semiconductor device according to the second embodiment has three features. First, an under electrode oxide film 9 is formed under the horizontal polysilicon film 11 and is different from the second interlayer insulating film 8. Second, the core oxide film 12 exits and a second horizontal electrode film 13 is formed on the core oxide film 12 and therefore the under electrode consists of the first and second horizontal polysilicon films 11,13 and sidewalls 14. Third, the storage electrode insulating film 15 is formed on the surface of the second horizontal electrode film 13 and sidewalls 14.

FIGS. 5A–5G are cross-sectional views showing respective steps of a method of manufacturing an under electrode of a capacitor according to a second embodiment of the present invention. It is noted that no description of the gate electrode, bit line, contact hole and the like which should be naturally provided in the semiconductor memory will be given.

As shown in FIG. 5A, an element separation region 2 is formed on a p-type silicon substrate 1 of memory cell array portion to define an element formation region. A second interlayer insulating film 8 made of NSG is formed on the element separation region 2 and the element formation region surrounded by the element separation region 2. A first electrode insulating film 9a made of PSG or BPSG is deposited on the second interlayer insulating film 8 to a thickness of about 500 nm. Although FIG. 5A illustrates a single-layered first electrode insulating film 8, a first interlayer insulating film 5 is actually present under the second interlayer insulating film 8.

As shown in FIG. 5B, a storage electrode contact hole 10a is formed in the first and second interlayer insulating film 5 and 8 and the first electrode insulating film 9a to expose the diffusion region of the element formation region of the substrate 1.

As shown in FIG. 5C, a polysilicon is buried in the storage electrode contact hole 10a to thereby form a contact plug 10. A first polysilicon film 11a is deposited on the first electrode insulating film 9 to a thickness of about 100 nm to electrically connect the first polysilicon film 11a with the contact plug 10.

As shown in FIG. 5D, a second electrode insulating film 12 made of BPSG or PSG is deposited on the first polysilicon film 11a to a thickness of about 500 nm and a second polysilicon film 13a is deposited on the second electrode insulating film 12a to a thickness of about 100 nm. An oxide film 20a is deposited on the second polysilicon film 13a to a thickness of about 100 nm.

As shown in FIG. 5E, the oxide film 20a, the second polysilicon film 13a, the second electrode insulating film 12a, and the first polysilicon film 11a are patterned by using a well-known photolithographic technique and etching technique to produce an etching stopper 20, the second horizontal electrode or a patterned conductive film 13, the core oxide film 12, the first horizontal electrode 11, and the under electrode oxide film 9, respectively. In this time, the first electrode insulating film 9a and the second interlayer insulating films 8 are different film and each film 9a and 8 has a different etching rate each other. Therefore, the second interlayer insulating film 8 is not etched when the first electrode insulating film 9a is etched. Accordingly, the height of sidewalls is easily controlled by the thickness of the first electrode insulating film 9a and the shortcut is prevented.

As shown in FIG. 5F, a polysilicon film 14a is deposited on the entire surface to a thickness of about 100 nm.

As shown in FIG. 5G, the polysilicon film 14a is etched-back to produce sidewalls 14. In this case, the etching stopper 20 prevents the second horizontal electrode film 13 from being etched. After the etching stopper 20 is removed, an under electrode consisted of the first and second horizontal polysilicon films 11,13 and the sidewalls 14 is completed. Further, a dielectric film 15, an upper or second storage electrode 16, and a third interlayer insulating film 17 are formed continuously shown in FIG. 4.

In the second embodiment according to the present invention, polysilicon is used as the material for the under electrodes 11, 13 and 14. However, not only may an electrode of polysilicon be used, but also a metal electrode of, for example, tungsten can be used. In addition, the electrode insulating films 9 and 12 may be made of, for example, titanium nitride. That is, it is sufficient that the electrode insulating films 9 and 12 are made of material different from that of the electrodes 11, 13, 14 and the second interlayer insulating film 8. Additionally, the first electrode insulating film 9 has a thickness of 500 nm. The film thickness is determined by an aspect ratio of a possible contact. In this embodiment, it is estimated that the thickness of the interlayer insulating films formed under the under electrode insulating film 9 (i.e. the sum of the thickness of the first interlayer insulating film 5 and that of the second interlayer insulating film 8) is about 700 nm. A necessary size of the capacity storage electrode contact is 0.15 $\mu$m. An aspect ratio of the possible contact is 8 (determined from anti-resist resistance during etching steps and the capability of electric connection to the diffused layer). Whereby, the possible thickness of interlayer insulating films is determined as 1.2 $\mu$m (0.15'8) and the thickness of the first electrode insulating film 9 is therefore determined as 500 nm. The thickness of the first electrode insulating film is not limited to 500 nm. An optimum thickness could be determined based on the above-mentioned estimate.

Figure 6:
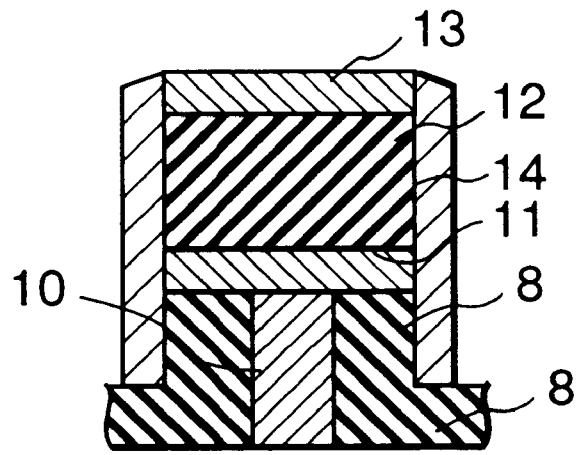
FIG. 6 is a cross-sectional view according to a third embodiment of the present invention.

Referring to the FIG. 6, the shape of the under electrode is that of the capacitor according to the second embodiment of the present invention and the insulating film under the under electrode is that of the film according to the first embodiment of the present invention.

Figure 7:
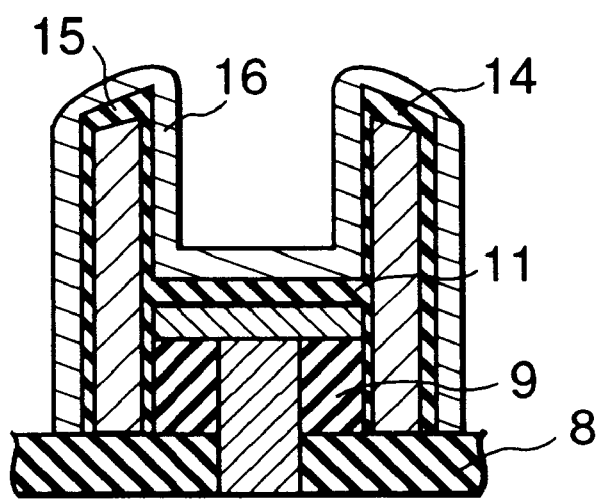
FIG. 7 is a cross-sectional view according to a fourth embodiment of the present invention.

Referring to the FIG. 7, the shape of the under electrode is that of the capacitor according to the first embodiment of the present invention and the insulating film under the under electrode is that of the film according to the second embodiment of the present invention.

It is apparent that the present invention is not limited to the above embodiments but may be modified and changed without departing from the scope and spirit of the present invention.

What is claimed is:

1. A method of manufacturing a semiconductor device comprising the steps of:

forming a first insulating film on a semiconductor substrate, forming a contact hole in said first insulating film, forming a first conductive film in said contact hole and on said first insulating film to bury said contact hole, forming a second insulating film on said first conductive film, selectively etching said second insulating film, said first conductive film, and a part of said first insulating film to produce a patterned second insulating film, a patterned first conductive film, and a patterned first insulating film respectively, said first insulating film being removed to a depth below said first conductive film, forming sidewalls made of a conductive material on sides of said patterned first and second insulating films and said patterned first conductive film to connect said sidewalls with said patterned first conductive film so that the ratio of the height of the part of said sidewalls connected with said side of said patterned first insulating film to the height of the part of said sidewalls connected with said side of said patterned second insulating film is not less than 0.5, removing said patterned second insulating film after said sidewalls are formed, forming a dielectric film on the surface of said patterned first conductive film and said sidewalls while keeping said sidewalls in contact with said sides of said patterned first insulating films, and forming a second conductive film to cover said dielectric film.

2. The method as claimed in claim 1, wherein said first insulating film and said second insulating film are made of different material.

3. The method as claimed in claim 1, further comprising the steps of, forming a second conductive film on said second insulating film after said second insulating film is formed, forming a etching stopper on said second conductive film, and patterning said etching stopper, said second conductive film to produce a patterned etching stopper, a patterned second conductive film, respectively, wherein said sidewalls are connected to not only said patterned first conductive film but also said patterned second conductive film.

4. A method of manufacturing a semiconductor device comprising the steps of:

forming a first insulating film on a first portion and a second portion on a semiconductor substrate, forming a contact hole in said first insulating film on said first portion, forming a first conductive film in said contact hole and on said first insulating film of said first portion and second portion to bury said contact hole, forming a second insulating film on said first conductive film of said first and second portions, said second insulating film being different material from said first insulating film, selectively etching said second insulating film, said first conductive film, and a part of said first insulating film on said first portion and removing said second insulating film, said first conductive film, and a part of said first insulating film on said second portion to produce a patterned second insulating film, a patterned first conductive film, and a patterned first insulating film respectively on said first portion, said first insulating film being removed to a depth below said first conductive film, forming sidewalls made of a conductive material on sides of said patterned first and second insulating films and said patterned first conductive film to connect said sidewalls with said patterned first conductive film so that the ratio of the height of the part of said sidewalls connected with said side of said patterned first insulating film to the height of the part of said sidewalls connected with said side of said patterned second insulating film is not less than 0.5, removing said patterned second insulating film after said sidewalls are formed, forming a dielectric film on the surface of said patterned first conductive film and said sidewalls while keeping said sidewalls in contact with said sides of said patterned first insulating films, and forming a second conductive film to cover said dielectric film.

5. The method as claimed in claim 4, wherein said first portion is a memory cell array portion wherein a plurality of memory cells are formed and said second portion is a peripheral circuit portion wherein a plurality of peripheral circuits are formed.

6. The method as claimed in claim 4, further comprising the steps of, forming a second conductive film on said second insulating film of said first and second portions after said second insulating film is formed, forming a etching stopper on said second conductive film, of said first and second portions and selectively etching said etching stopper and said second conductive film on said first portion and removing said etching stopper and said second conductive film on said second portion to produce a patterned etching stopper and a patterned second conductive film on said first portion, respectively, wherein said sidewalls are connected to not only said patterned first conductive film but also said patterned second conductive film.

7. A method of manufacturing a semiconductor device comprising the steps of;

forming a first insulating film on a semiconductor substrate, forming a second insulating film on said first insulating film, said second insulating film formed by different material from said first insulating film, forming a contact hole in said second insulating film and in said first insulating film, forming a first conductive film in said contact hole and on said second insulating film to bury said contact hole, forming a third insulating film on said first conductive film, selectively etching said third insulating film, said first conductive film, and said second insulating film to produce a patterned third insulating film, a patterned second insulating film and a patterned first conductive film respectively, said first insulating film acting as an etch stop layer forming sidewalls made by a conductive material on sides of said patterned second and third insulating films and said patterned first conductive film to connect said sidewalls with said patterned first conductive film removing said patterned third insulating film after said sidewalls are formed, forming a dielectric film on the surface of said patterned first conductive film and said sidewalls while keeping said sidewalls in contact with said sides of said patterned second insulating films, and forming a second conductive film to cover said dielectric film.

8. The method as claimed in claim 7, wherein said first insulating film and said third insulating film are made of different material.

9. The method as claimed in claim 7, further comprising the steps of, forming a second conductive film on said second insulating film after said second insulating film is formed, forming a etching stopper on said second conductive film, and patterning said etching stopper, said second conductive film to produce a patterned etching stopper, a patterned second conductive film, respectively, wherein said sidewalls are connected to not only said patterned first conductive film but also said patterned second conductive film.

10. The method as claimed in claim 1, wherein the step of forming said first conductive film comprises steps of:

burying a conductive material into said contact hole, and forming another conductive film on said first insulating film and said conductive material in said contact hole.

11. The method as claimed in claim 4, wherein the step of forming said first conductive film comprises steps of:

burying a conductive material into said contact hole, and forming another conductive film on said first insulating film and said conductive material in said contact hole.

12. The method as claimed in claim 7, wherein the step of forming said first conductive film comprises steps of:

burying a conductive material into said contact hole, and forming another conductive film on said first insulating film and said conductive material in said contact hole.

13. The method of claim 1, wherein said depth is determined to provide physical support to said side walls.

14. The method of claim 4, wherein said depth is determined to provide physical support to said side walls.

15. A method of manufacturing a semiconductor device comprising the steps of:

forming a first insulating film on a semiconductor substrate, forming a contact hole in said first insulating film, forming a first conductive film in said contact hole and on said first insulating film to bury said contact hole, forming a second insulating film on said first conductive film, selectively etching said second insulating film, said first conductive film, and a part of said first insulating film to produce a patterned second insulating film, a patterned first conductive film, and a patterned first insulating film respectively, said first insulating film being removed to a depth below said first conductive film, forming sidewalls made of a conductive material on sides of said patterned first and second insulating films and said patterned first conductive film to connect said sidewalls with said patterned first conductive film so that the ratio of the height of the part of said sidewalls connected with said side of said pattern first insulating film to the height of the part of said sidewalls connected with said side of said patterned second insulating film is substantially one to two, removing said patterned second insulating film after said sidewalls are formed, forming a dielectric film on the surface of said patterned first conductive film and said sidewalls while keeping said sidewalls in contact with said sides of said patterned first insulating films, and forming a second conductive film to cover said dielectric film.

16. A method of manufacturing a semiconductor device comprising the steps of:

forming a first insulating film on a first portion and a second portion on a semiconductor substrate, forming a contact hole in said first insulating film on said first portion, forming a first conductive film in said contact hole and on said first insulating film of said first portion and second portion to bury said contact hole, forming a second insulating film on said first conductive film of said first and second portions, said second insulating film being different material from said first insulating film, selectively etching said second insulating film, said first conductive film, and a part of said first insulating film on said first portion and removing said second insulating film, said first conductive film, and a part of said first insulating film on said second portion to produce a patterned second insulating film, a patterned first conductive film, and a patterned first insulating film respectively on said first portion, said first insulating film being removed to a depth below said first conductive film, forming sidewalls made of a conductive material on sides of said patterned first and second insulating films and said patterned first conductive film to connect said sidewalls with said patterned first conductive film so that the ratio of the height of the part of said sidewalls connected with said side of said patterned first insulating film to the height of the part of said sidewalls connected with said side of said patterned second insulating film is substantially one to two, removing said patterned second insulating film after said sidewalls are formed, forming a dielectric film on the surface of said patterned first conductive film and said sidewalls while keeping said sidewalls in contact with said sides of said patterned first insulating films, and forming a second conductive film to cover said dielectric film.

* * * * *